(12) United States Patent
Liu

(10) Patent No.: US 7,622,968 B2
(45) Date of Patent: Nov. 24, 2009

(54) DELAY LOCKED LOOP

(75) Inventor: Wei-Li Liu, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 11/774,617

(22) Filed: Jul. 9, 2007

(65) Prior Publication Data

US 2008/0169851 A1 Jul. 17, 2008

(30) Foreign Application Priority Data

Jan. 17, 2007 (TW) .............................. 96101781 A

(51) Int. Cl.
*H03L 7/06* (2006.01)
(52) U.S. Cl. ...................... 327/158; 327/156
(58) Field of Classification Search ......... 327/147–149, 327/156–158
See application file for complete search history.

(56) References Cited

U.S. PATENT DOCUMENTS

| 6,078,864 A | * | 6/2000 | Long et al. ................. 701/209 |
| 6,437,619 B2 | | 8/2002 | Okuda et al. |
| 6,847,241 B1 | * | 1/2005 | Nguyen et al. ............. 327/158 |
| 7,157,951 B1 | * | 1/2007 | Morrison et al. ........... 327/263 |
| 7,202,721 B2 | * | 4/2007 | Jeon .......................... 327/158 |
| 7,339,407 B2 | * | 3/2008 | Jakobs et al. ............... 327/158 |
| 2003/0052718 A1 | * | 3/2003 | Takai ......................... 327/158 |

* cited by examiner

*Primary Examiner*—Dinh T. Le
(74) *Attorney, Agent, or Firm*—Jianq Chyun IP Office

(57) ABSTRACT

In a delay locked loop, a phase detector compares the phases of an input signal and an output signal; a delay line delays the input signal, wherein the delay line includes a plurality of unit delay elements connected in series and the value of the unit delay of each of the unit delay elements is adjusted by a control signal; a multiplexer selects a number of delay stages of the unit delay elements according to the phase comparison result and generates the output signal. The control signal is related to a clock information signal. When the input signal is high frequency, the value of the unit delay would be small; and when the input signal is low frequency, the value of the unit delay would be large.

7 Claims, 3 Drawing Sheets

DELAY LOCKED LOOP

CROSS-REFERENCE TO RELATED APPLICATION

This application claims the priority benefit of Taiwan application serial no. 96101781, filed Jan. 17, 2007. All disclosure of the Taiwan application is incorporated herein by reference.

BACKGROUND OF THE INVENTION

1. Field of the Invention

The present invention generally relates to a delay locked loop (DLL), and more particularly, to a delay locked loop having adjustable unit delay elements.

2. Description of Related Art

For the operation of a DDR SDRAM (double data rate synchronous DRAM), a plurality of reference clock signals with a same frequency but different phases are used. A delay locked loop is used to lock the input reference clock signal and to generate a plurality of output clock signals with a same frequency but phases different from that of the input reference clock signal.

FIG. 1 is a block diagram of a conventional delay locked loop. Referring to FIG. 1, a conventional delay locked loop 10 mainly includes a phase detector 11, a delay line 12 and a multiplexer 13. The delay line 12 includes plural stages of unit delay elements connected in series. The output signal of a preceding stage of unit delay element would be delayed by the following stage of unit delay element. For simplicity, the delay line 12 herein includes, for example, four stages of unit delay element 12-1~12-4. The amount of delay of each unit delay element, 12-1, 12-2, 12-3 and 12-4, which is termed as unit delay amount or unit delay, is fixed with the prior art and denoted by tUD. If the period of an input signal IN is tCK, when the delay locked loop is locked, we have tCK=n*tUD where n denotes number of stage, i.e. the number of the unit delay elements composing the delay line 12. The number of stages and the unit delay elements would determine the operation range of the delay locked loop.

All output signals of the unit delay elements 12-1~12-4 are input to the multiplexer 13. The multiplexer 13 then selects one or more delay stages among the unit delay elements 12-1~12-4 according to the output of the phase detector 11 to generate an output signal OUT. For example, the multiplexer 13 can select a single delay stage, and thus the input signal IN is delayed by the unit delay element 12-1 into the output signal OUT; the multiplexer 13 can select two delay stages, and thus the input signal IN is delayed by the unit delay elements 12-1 and 12-2 into the output signal OUT; the multiplexer 13 can also select a four delay stages, and thus the input signal IN is delayed by the unit delay elements 12-1~12-4 into the output signal OUT.

The phase detector 11 is used to compare the input signal IN with the output signal OUT to get a phase difference and output the comparison result to the multiplexer 13.

With a higher and higher frequency of a clock signal (i.e. a shorter and shorter signal period) today, the corresponding unit delay tUD requires to be less and less, which would increasingly restrict the operation range of a delay locked loop. In addition, considering a unit delay provided by the conventional unit delay element is fixed in the prior art, in order to increase the operation range it can be achieved only by increasing the number of stages.

Based on the above-mentioned situation, an improved delay locked loop is really expected by the relevant manufactures so as to overcome the disadvantages of the prior art.

SUMMARY OF THE INVENTION

Accordingly, the present invention is directed to a delay locked loop having variable unit delay elements to increase the operation range thereof.

The present invention provides a delay locked loop having variable unit delay elements. For a clock signal with high frequency, the value of the unit delay of the delay locked loop is small; for a clock signal with low frequency, the value of the unit delay of the delay locked loop is large.

As embodied and broadly described herein, the present invention provides a delay locked loop, which includes: a phase detector for comparing the phase relationship between an input signal and an output signal; a delay line for delaying the input signal, wherein the delay line includes a plurality of unit delay elements connected in series and the value of unit delay of each of the unit delay elements is adjustable by a control signal; a multiplexer for selecting a number of delay stages of the unit delay elements according to the phase comparison result to generate the output signal. The control signal is related to a clock information signal. The clock information signal includes result for frequency detection, an output signal of a mode register or a CAS (column address strobe) delay information. Alternatively, the control signal can also be generated by a control unit according to the clock information signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the present embodiment, unit delay elements of a delay line are adjustable. In other words, the unit delay of each unit delay element is adjustable. When an input signal is a high frequency signal, the value of the unit delay of the unit delay element is small; when an input signal is a low frequency signal, the value of the unit delay of the unit delay element is large. Besides, the control signal for controlling the unit delay varies with different clock information, wherein the clock information can be provided by, for example, a phase detector, an output signal of a mode register or a CAS (column address strobe) delay information.

Figure 1:
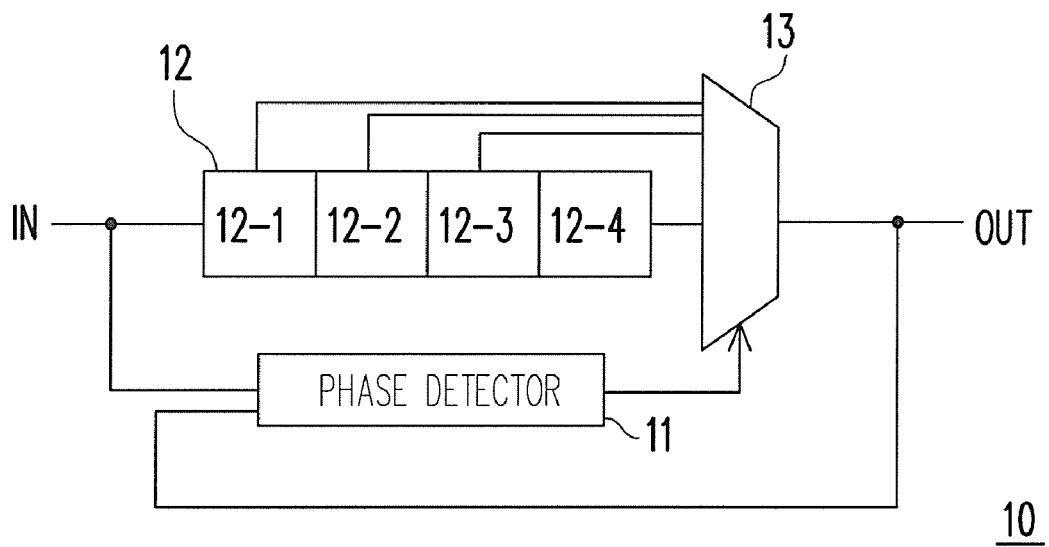
FIG. 1 is a block diagram of a conventional delay locked loop.
Figure 2:
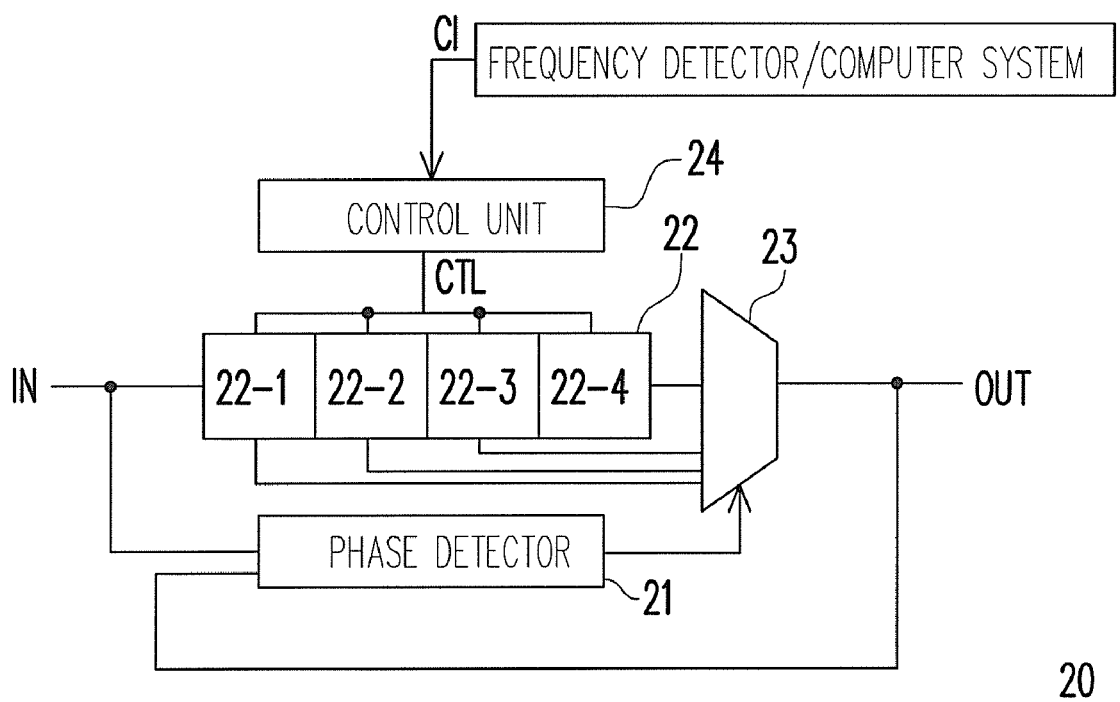
FIG. 2 is a block diagram of a delay locked loop according to an embodiment of the present invention.

FIG. 2 is a block diagram of a delay locked loop according to an embodiment of the present invention. The delay locked loop 20 herein includes a phase detector 21, a delay line 22, a multiplexer 23 and a control unit 24.

The delay line 22 includes plural stages of unit delay elements connected in series. The output signal from the preceding stage of unit delay element would be delayed by the following stage of unit delay element. For simplicity, the delay line 22 herein includes four stages of unit delay element 22-1~22-4. The unit delay of each unit delay element 22-1~22-4 is adjustable. And, the control signal CTL generated by the control unit 24 controls the unit delay of the unit delay elements 22-1~22-4.

All the output signals of the unit delay elements 22-1~22-4 are input to the multiplexer 23. The multiplexer 23 then would select a number of delay stages among the unit delay elements 22-1~22-4 according to the output of the phase detector 21, so as to generate an output signal OUT. For example, the multiplexer 23 can select a single delay stage, and thus the input signal IN is delayed by the unit delay element 22-1 into the output signal OUT; the multiplexer 23 can select two delay stages, and thus the input signal IN is delayed by the unit delay elements 22-1 and 22-2 into the output signal OUT; the multiplexer 23 can also select a four delay stages, and thus the input signal IN is delayed by the unit delay elements 22-1~22-4 into the output signal OUT.

The phase detector 21 is used to compare the input signal IN with the output signal OUT to get a phase difference and output the comparison result to the multiplexer 23.

The control unit 24 generates a control signal CTL according to a clock information signal CI. The control signal CTL herein, for example, includes four bits CTL[0]~CTL[3]. The clock information signal CI comes from: (1) a detection result of a frequency detector for detecting a clock signal of a system (for example, a computer system); (2) an output signal of a mode register provided by a system (for example, a computer system); (3) a CAS (column address strobe) delay information provided by a system (for example, a computer system).

The above-mentioned frequency detector detects the clock signal of the computer system and takes the information of the frequency (or period) of the clock signal as the clock information signal CI to be provided to the control unit 24. The relationships between the system clock signal, the control signal CTL and the unit delay can be exemplarily as shown by Table 1.

TABLE 1

| System Clock Signal (period in unit of ns, i.e. $10^{-9}$ sec) | Control Signal CTL | Unit delay (in unit of ps, i.e. $10^{-15}$ sec) |
| --- | --- | --- |
| 5 | 0000 | 200 |
| 6 | 0001 | 250 |
| 7 | 0011 | 300 |
| 8 | 0111 | 350 |
| 9 | 1111 | 400 |

If the output signal of mode register (assuming the output signal is expressed by 2-bits) is served as the clock information signal CI, the relationships between the output signal of mode register, the control signal CTL and the unit delay can be exemplarily as shown by Table 2.

TABLE 2

| Output Signal of Mode Register (2-bits) | Control Signal CTL (4-bits) | Unit delay (in unit of ps, i.e. $10^{-15}$ sec) |
| --- | --- | --- |
| 00 | 0000 | 200 |
| 01 | 0001 | 250 |
| 10 | 0011 | 300 |
| 11 | 0111 | 350 |

Figure 3A:
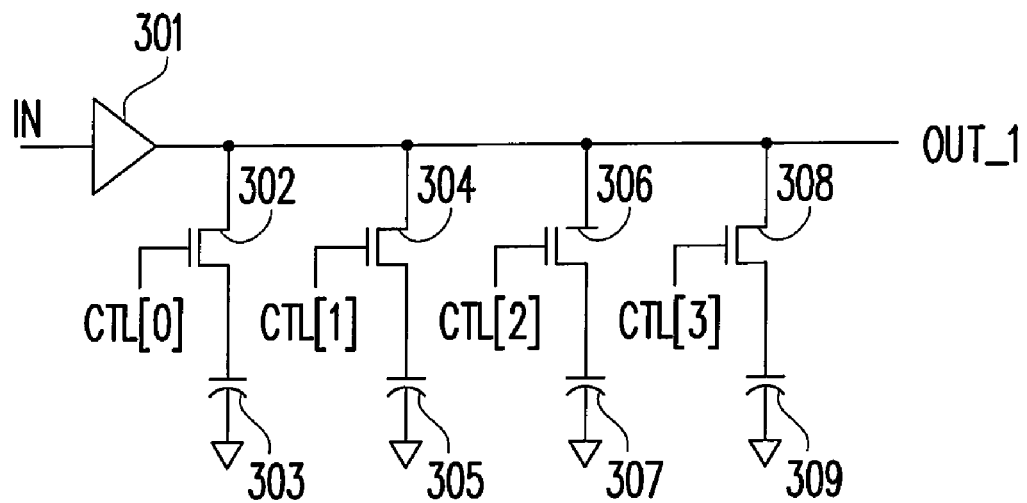
FIGS. 3A-3C are several implementations of the unit delay element according to the present embodiment.
Figure 3B:
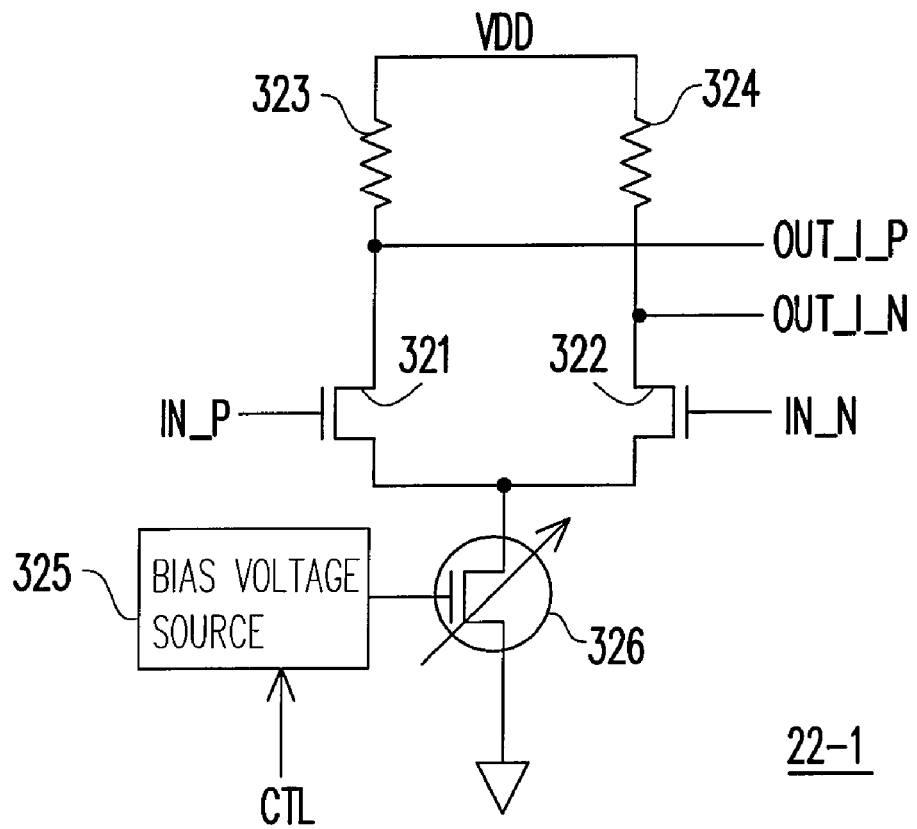
Figure 3C:
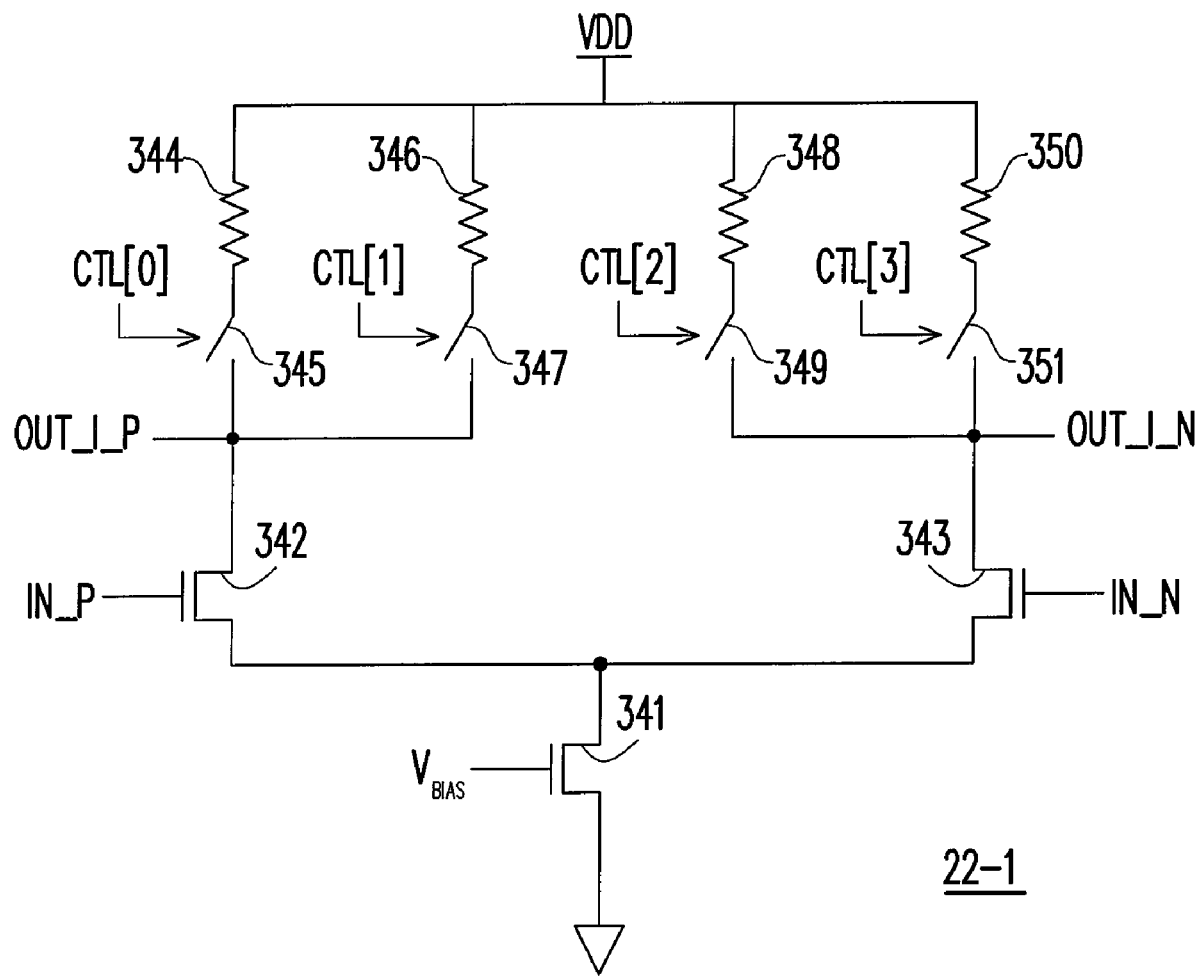

FIGS. 3A-3C are several implementations of the unit delay element according to the present embodiment. In the embodiment, the architectures of all the unit delay elements are the same. In the following therefore, the unit delay element 22-1 is exemplarily described.

The unit delay element 22-1 of FIG. 3A includes a buffer unit 301, switches 302, 304, 306 and 308 and capacitors 303, 305, 307 and 309. The buffer unit 301 receives an input signal IN, while the output signal OUT_1 thereof is coupled to the following unit delay element 22-2.

The switches 302, 304, 306 and 308 can be implemented by MOS transistors, for example, NMOS transistors. The drains of the switches 302, 304, 306 and 308 are together coupled to the output terminal of the buffer unit 301, the gates thereof are respectively coupled to a respective one of the control signals CTL[0]~CTL[3] and the sources thereof are respectively coupled to a terminal of each of the capacitors 303, 305, 307 and 309. Another terminal of each of the capacitors 303, 305, 307 and 309 is grounded.

The switches 302, 304, 306 and 308 are respectively controlled by the control signal CTL[0]~CTL[3]. The on/off states of the switches 302, 304, 306 and 308 would change the equivalent capacitance value of the unit delay element 22-1, and further change the unit delay of the unit delay element 22-1.

The unit delay element 22-1 of FIG. 3B includes transistors 321 and 322, resistors 323 and 324, a bias voltage source 325 and a variable current source 326. The configuration of FIG. 3B is of differential type. IN_P and IN_N herein denote differential input signals, while OUT_1_P and OUT_1_P denote differential output signals.

The transistors in FIG. 3B are, for example, NMOS transistors. The drain of the transistor 321 is coupled to a terminal of the resistor 323, the gate thereof receives the signal IN_P and the source thereof is coupled to the variable current source 326. The drain of the transistor 322 is coupled to a terminal of the resistor 324, the gate thereof receives the signal IN_N and the source thereof is also coupled to the variable current source 326.

The resistor 323 is coupled between a voltage source VDD and the drain of the transistor 321. The resistor 324 is coupled between the voltage source VDD and the drain of the transistor 322.

The bias voltage source 325 determines the current amount generated by the variable current source 326 according to the control signal CTL. Greater current would result in less unit delay, while less current would result in greater unit delay.

The unit delay element 22-1 of FIG. 3C includes transistors 341, 342 and 343, resistors 344, 346, 348 and 350, and switches 345, 347, 349 and 351. The configuration of FIG. 3C is also of differential type. IN_P and IN_N herein denote differential input signals, while OUT_1_P and OUT_1_P denote a differential output signals.

The transistors in FIG. 3C are, for example, NMOS transistors. The drain of the transistor 341 is coupled to both the sources of the transistors 342 and 343, the gate of the transistor 341 is biased by a bias voltage source $V_{BIAS}$ and the source thereof is grounded. The drain of the transistor 342 is coupled to both a terminal of the switch 345 and a terminal of the switch 347, the gate of the transistor 342 receives the input signal IN_P and the source thereof is coupled to the drain of the transistor 341. The drain of the transistor 343 is coupled to both a terminal of the switch 349 and a terminal of the switch 351, the gate of the transistor 343 receives the input signal IN_N and the source thereof is coupled to the drain of the transistor 341.

The switch 345 is able to control the on/off state between the resistor 344 and the transistor 342; the switch 347 is able to control the on/off state between the resistor 346 and the transistor 342; the switch 349 is able to control the on/off state between the resistor 348 and the transistor 343; the switch 351 is able to control the on/off state between the resistor 350 and the transistor 343.

The resistor 344 is coupled between the voltage source VDD and the switch 345; the resistor 346 is coupled between the voltage source VDD and the switch 347; the resistor 348 is coupled between the voltage source VDD and the switch 349; the resistor 350 is coupled between the voltage source VDD and the switch 351.

The switches 345, 347, 349 and 351 are respectively controlled by the control signals CTL[0]~CTL[3]. The on/off states of the switches 345, 347, 349 and 351 would change the equivalent capacitance value of the unit delay element 22-1, and further change the unit delay of the unit delay element 22-1.

In summary, the present embodiment has at least the following advantages: (1) since the unit delay for a unit delay element is adjustable, the operation range of a delay locked loop can be increased; (2) since the unit delay for a unit delay element is related to the clock information, thus the unit delay for a unit delay element can be reduced in respond to an input reference clock with high frequency; and vice versa.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A delay locked loop, for delaying an input signal into an output signal, comprising:
    a phase detector, for comparing a phase relationship between the input signal and the output signal to output a phase comparison result;
    an independent control unit, for generating a control signal independent from the input signal and the output signal according to a clock information signal;
    a delay line, for delaying the input signal, wherein the delay line comprises a plurality of unit delay elements connected in series, a value of unit delay of each of the unit delay elements is adjusted by a control signal generated by the control unit, and
    a multiplexer, for selecting a number of delay stages of the unit delay elements according to the phase comparison result provided by the phase detector to generate the output signal.

2. The delay locked loop according to claim 1, wherein the clock information signal comprises a frequency detection result outputted from a frequency detector of a system.

3. The delay locked loop according to claim 1, wherein the clock information is provided by a system.

4. The delay locked loop according to claim 3, wherein the system comprises a computer system.

5. The delay locked loop according to claim 1, wherein each unit delay element comprises:
    a buffer unit, comprising an input terminal and an output terminal;
    a plurality of capacitors, each capacitor comprising a first terminal and a grounded second terminal; and
    a plurality of switches, wherein the switches are controlled by the control signal to selectively determine the on/off states between the output terminal of the buffer unit and the first terminals of the capacitors to change the unit delay of each unit delay element.

6. The delay locked loop according to claim 1, wherein when the input signal is of differential input signal, each unit delay element comprises:
    a first transistor, comprising a first terminal, a control terminal coupled to the input signal or to an output signal of the preceding unit delay element and a second terminal;
    a second transistor, comprising a first terminal, a control terminal coupled to the input signal or to the output signal of the preceding unit delay element and a second terminal;
    a first resistor, coupled between a voltage source and the first terminal of the first transistor;
    a second resistor, coupled between the voltage source and the first terminal of the second transistor;
    a bias voltage source; and
    a variable current source, coupled to the second terminal of the first transistor, the second terminal of the second transistor and the bias voltage source;
    wherein the bias voltage source changes a current generated by the variable current source according to the control signal, wherein the current changes the unit delay of each unit delay element.

7. The delay locked loop according to claim 1, wherein when the input signal is of differential input signal, each unit delay element comprises:
    a first transistor, comprising a first terminal, a control terminal to receive a bias voltage and a grounded second terminal;
    a second transistor, comprising a first terminal, a control terminal coupled to the input signal or to an output signal of the preceding unit delay element and a second terminal coupled to the first terminal of the first transistor;
    a third transistor, comprising a first terminal, a control terminal coupled to the input signal or to the output signal of the preceding unit delay element and a second terminal coupled to the first terminal of the first transistor;
    a first resistor, comprising a first end coupled to a voltage source and a second end;
    a second resistor, comprising a first end coupled to the voltage source and a second end;
    a third resistor, comprising a first end coupled to the voltage source and a second end;
    a fourth resistor, comprising a first end coupled to the voltage source and a second end;
    a first switch, controlled by the control signal to selectively determine the on/off state between the first terminal of the second transistor and the second end of the first resistor;
    a second switch, controlled by the control signal to selectively determine the on/off state between the first terminal of the second transistor and the second end of the second resistor;
    a third switch, controlled by the control signal to selectively determine the on/off state between the first terminal of the third transistor and the second end of the third resistor; and
    a fourth switch, controlled by the control signal to selectively determine the on/off state between the first terminal of the third transistor and the second end of the fourth resistor.

* * * * *